United States Patent [19]

Ma et al.

[11] Patent Number: 5,003,622
[45] Date of Patent: Mar. 26, 1991

[54] PRINTED CIRCUIT TRANSFORMER

[75] Inventors: John Y. Ma, Tai Po; Po P. Leung, Kowloon, both of Hong Kong

[73] Assignee: Astec International Limited, Hong Kong, Hong Kong

[21] Appl. No.: 412,949

[22] Filed: Sep. 26, 1989

[51] Int. Cl.$^5$ .............................................. H04B 1/26
[52] U.S. Cl. .................................... 455/327; 333/26; 455/330
[58] Field of Search ................. 333/24 R, 25, 26, 246; 455/327; 343/859

[56] References Cited

U.S. PATENT DOCUMENTS

| | | | |
|---|---|---|---|
| 4,193,048 | 3/1980 | Nyhus | 333/26 |
| 4,302,739 | 11/1981 | Hattford | 333/26 X |
| 4,355,421 | 10/1982 | Seely | 333/26 X |
| 4,430,758 | 2/1984 | Snyder | 333/26 X |

OTHER PUBLICATIONS

*Radio Amateur's Handbook*, American Radio Relay League (1969) pp. 349–351.
Hitachi HSM88AS & HSM88ASR Schottky Barrier Twin Diodes (Sep. 1, 1986) (2 pages).
Bert C. Henderson, "Mixers: Part 2 Theory and Technology," RF and Microwave Component Designer's Handbook, Watkins Johnson Company 1988/89, pp. 759–756.

*Primary Examiner*—Paul Gensler
*Attorney, Agent, or Firm*—Kareem M. Irfan

[57] ABSTRACT

Circuits such as balanced diode mixers require balanced transformers. For ultrahigh frequency operation, a balanced transformer is formed as part of a printed circuit on a planar substrate of insulating material. The balanced transformer has a center-tapped winding formed by a loop of a strip transmission line having first and second coextensive elongated conductors disposed on the substrate. Preferably the first and second conductors are disposed adjacent each other on respective opposite sides of the substrate. At a first end portion of the strip transmission line, the second conductor is connected to a center tap, and at a second end portion of the strip transmission line, the first conductor is also connected to the center tap. For a balun transformer, the center tap is a ground plane provided by conductive regions disposed on the substrate. Preferably an unbalanced signal is fed into the transformer at a second winding including at least a third elongated conductor disposed on the substrate coextensive with the first and second conductors.

19 Claims, 3 Drawing Sheets

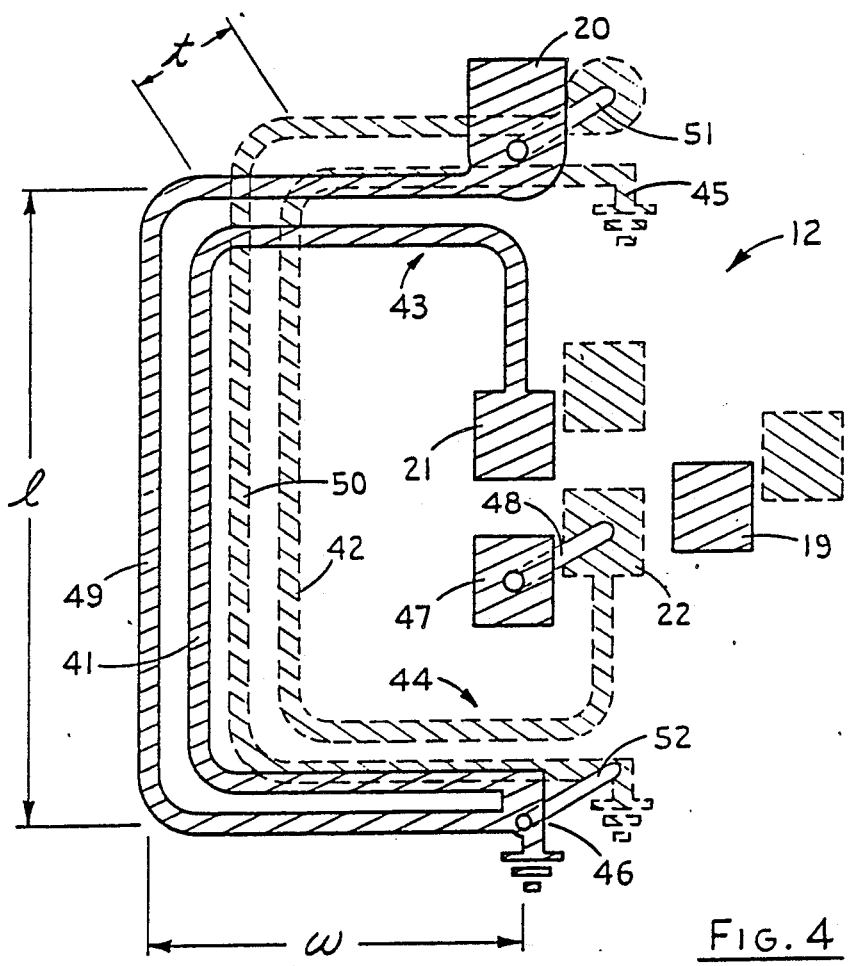
FIG. 4
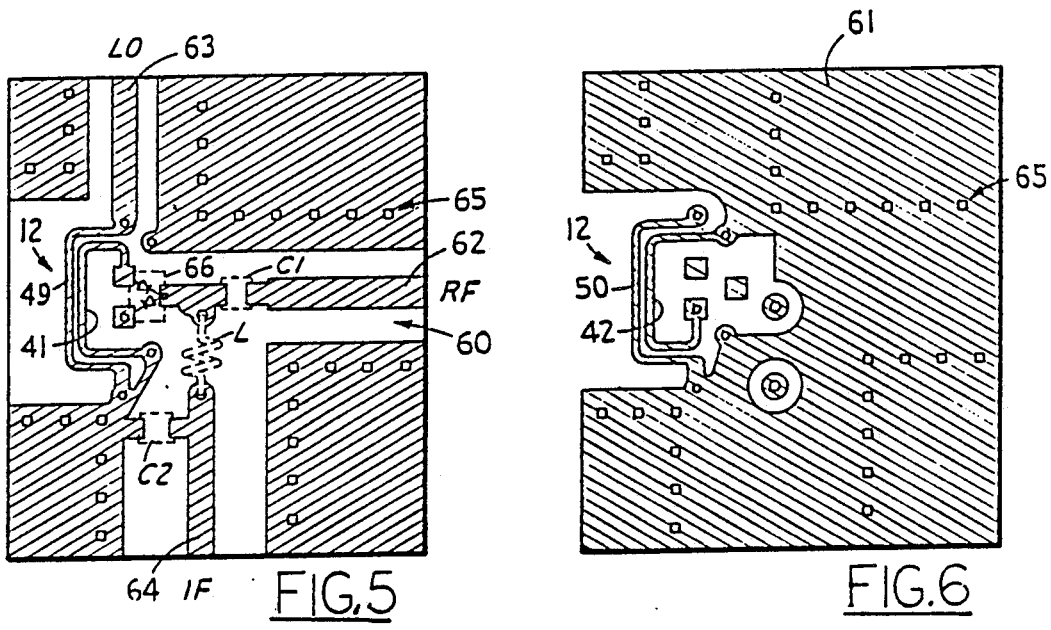
FIG. 5
FIG. 6

PRINTED CIRCUIT TRANSFORMER

FIELD OF THE INVENTION

The present invention relates generally to ultrahigh frequency circuits, and more particularly to ultrahigh frequency circuits that are printed on a circuit board or ceramics substrate. In particular, the present invention relates to the fabrication of a transformer having windings printed on the circuit board or substrate.

BACKGROUND OF THE INVENTION

Unbalanced circuits such as coaxial cable and radio-frequency amplifiers are generally preferred for simplicity and economy. But for increased performance, balanced circuits are sometimes desirable. A rather critical stage in a conventional radio receiver, for example, is a radio frequency mixer that converts a selected radio frequency to a fixed intermediate frequency. The ability of the radio receiver to reject intermodulation interference, for example, is primarily a function of the performance of the radio frequency mixer. In the ideal case, the mixer multiplies radio frequency signals by a local oscillator signal to produce corresponding intermediate frequency signals. In practice the mixer also multiplies or "mixes" the radio frequency signals among themselves to obtain some level of interfering signal at the intermediate frequency.

Mixers having close to ideal performance are known as "balanced" mixers. Balanced mixers use balanced signals which are fed through non-linear components and then combined to provided cancellation of certain undesired signals. In particular, it is possible to cancel the fundamental and odd-order intermodulation components. Balanced mixers, however, typically require at least one balance transformer. The balanced transformer typically includes windings on a toroidal ferrite core. The winding of such a transformer is therefore a relative expensive operation. Also, the assembly of such a transformer onto a circuit board or substrate involves additional cost. For economy, the transformer leads are provided by the ends of the wires forming the transformer's windings which require hand insertion and soldering to the circuit board, with careful attention to dressing of the leads to maintain balance of the signals. The tranformers is then secured to the circuit board by applying cement.

To avoid the costs associated with the fabrication and assembly of the balanced transformer, it would be desirable to manufacture the balanced transformer as part of the printed circuit itself.

SUMMARY OF THE INVENTION

Briefly, in accordance with the present invention, a transformer is formed as part of a printed circuit on a planar substrate of insulating material. The transformer has a center-tapped winding formed by a loop of a strip transmission line having first and second coextensive elongated conductors diposed on the substrate. Preferably the first and second conductors are disposed adjacent each other on respective opposite sides of the substrate. At first end portion of the strip transmission line, the second conductor is connected to a center tap, and at a second end portion of the strip transmission line, the first conductor is also connected to the center tap. For a balun transformer, the center tap is a ground plane provided by a conductive regions disposed on the substrate. Preferably an unbalanced signal is fed into the transformer at a second winding including at least a third elongated conductor disposed on the substrate coextensive with the first and second conductors.

BRIEF DESCRIPTIONS OF THE DRAWINGS

Other objects and advantages of the invention will become apparent upon reading the following detailed description and upon reference to the drawings in which:

FIG. 4 is an expanded view of the front and back printed circuit traces of the preferred balanced transformer in accordance with the present invention;

FIG. 5 is a top view of a circuit board including the balanced mixer of FIG. 1;

FIG. 6 is a view of the bottom trace of the circuit board of FIG. 5, as would be seen by looking through the circuit board of FIG. 5;

Figure 1:
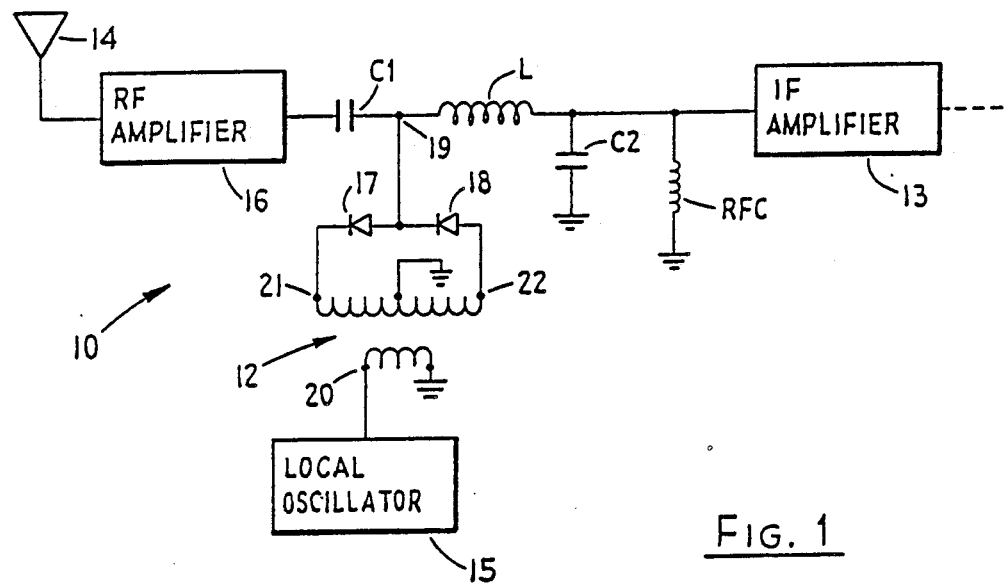
FIG. 1 is a schematic diagram of a singly-balanced mixer employing a balun transformer in accordance with the present invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

Turning now to FIG. 1, there is a shown a schematic diagram of the front end of a ultrahigh-frequency radio receiver generally designated 10 having a mixer circuit generally designated 11 incorporating a balanced transformer 12 in accordance with the present invention. The radio receiver 10 employs the conventional superheterodyne principle to uses in an intermediate-frequency (IF) amplifier 13 having a fixed intermediate frequency for amplifying a signal selected from a number of radio frequency signals received at an antenna 14. The desired radio frequency is selected by tuning the frequency of a local oscillator 15 to a frequency that is offset from the desired radio frequency by an amount equal to the fixed intermediate frequency.

It is known that any non-linear circuit element, such as a diode or a bipolar or field-effect transistor, can be used as a mixer because the non-linearity in the circuit element includes a "square-law" term causing multiplication between sinusoidal components of different frequencies to generate sum and difference frequencies. But a mixer employing a single non-linear element has the disadvantage that product signals are also generated by the mixing or multiplying together of different radio frequency signals among themselves, as well as between the local oscillator signal and each of the radio frequency signals. It is known that this problem can be solved by using more than one non-linear element and arranging the non-linear elements on a balanced circuit.

The most elementary form of such a balanced mixer is balanced with respect to the radio frequency signals but not with respect to the local oscillator signal. In this case, the balanced mixer is knwon as a "singly-balanced" mixer. In addition to preventing the radio frequency signals from being mixed among themselves, the singly-balanced mixer also suppresses odd order intermodulation products of the radio frequency signals.

In general, the problem of intermodulation interference is particularly troublesome in a superheterodyne receiver. Since the intermodulation products occur at the intermediate frequency, the intermodulation interference cannot be eliminated by increasing the selectivity of the intermediate frequency amplifier. When it is desired to tune the superheterodyne receiver over a broad band of frequencies, or when it is desired to obtain the best possible performance from the receiver, the presence of intermodulation interference may become a limiting factor. In this case it may become necessary to use a balanced mixer.

A balanced mixer can also be used to prevent radiation of the local oscillator signal from the antenna 14. In practice a radio frequency amplifier 16 may also help to isolate the antenna 14 from the local oscillator 15, but the primary purpose of the radio frequency amplifier is to improve the noise figure of the receiver by providing gain to overcome conversion loss in the mixer and loss in tuned radio frequency circuits coupled between the antenna and the mixer. But the degree of isolation provided by the ratio frequency amplifier 16 is limited by the desire to limit the gain of the radio frequency amplifier to no more than is needed to provide a good noise figure for the radio receiver. Excessive gain in the radio frequency amplifier tends to increase the intermodulation interference because the intermodulation products generated in the mixer increase as the square or a higher order of the radio frequency signal level that is input to the mixer.

A preferred form of singly-balanced mixer 11 is shown in FIG. 1. To multiply the radio frequency components by the local oscillator signal, a pair of directional diodes 17, 18 function as an electronic switch that is alternatively opened and closed at the local oscillator frequency. This electronic switch alternatively shunts to ground an intermediate connection point 19 between the radio frequency amplifier 16 and the intermediate amplifier 13. In particular, the diodes 17 and 18 have a conductive state when current induced from the local oscillator 15 is flowing in a forward direction through the diodes, and a non-conductive state when the diodes 17 and 18 are reverse-biased by the signal from the local oscillator The ability of the diodes 17 and 18 to function as an electronic switch is highly dependent upon the degree to which the transformer 12 is balanced. The degree to which the transformer 12 is balanced determines the degree to which the local oscillator signal is absent from the intermediate connection point 19. Also, when the diodes 17 and 18 are in their conductive state, the transformer 12 should provide a low impedance connection between the intermediate point 19 and signal ground. Moreover, the transformer 12 should be balanced with respect to ground in this fashion over a relatively wide range of frequencies. A transformer having these desired characteristics is known as a "balun" transformer. Such a transformer may convert an unbalanced signal from a terminal 20 to a balanced signal on terminals 21 and 22 such that the voltage on terminal 21 with respect to ground is substantially equal and opposite to the voltage on terminal 22 with respect to ground. As will be further described below in connection with FIG. 4, such as transformer can be fabricated as a printed circuit in accordance with the present invention.

In order for the diodes 17 and 18 to function as a shunt switch between the radio frequency amplifier 16 and the intermediate frequency amplifier 13, it is necessary to provide an impedance between the radio frequency amplifier 16 and the intermediate connection point 19 that is relatively small in comparison to the impedance of the electronic switch when the electronic switch is closed. Preferably this impedance is provided by a capacitance C1. Also, it is desirably to couple the intermediate connection point 19 to the intermediate frequency amplifier 13 by a frequency selectively circuit that isolates the radio frequency amplifier 16 from the intermediate frequency amplifier 13. Preferably this coupling is provided by a lowpass filter including a series inductor L and a shunt capacitor C2. The values of the inductance L and the capacitance C2 are selected for resonance at approximately the intermediate frequency. Also, it is desirable for the value of the capacitor C1 to be selected for resonance with the inductance L at approximately the radio frequency. For a radio frequency of 0.95 to 1.75 GHz and an intermediate frequency of 479.5 MHz, and impedance of about 50 ohms for the radio frequency amplifier 16 and the intermediate frequency amplifier 13, for example, the values of the capacitors C1 and C2 should be about 2 picofarads and 4 picofarads, respectively, and the inductor L should have a value of approximately 0.03 microhenries.

Also shown in the mixer circuit of FIG. 1 is a radio frequency choke (RFC) that shunts the intermediate point 19 to ground for lower frequencies and provides a DC return path for the diodes 17 and 18. The inductance of the radio frequency choke (RFC), for example, should be about 10 to 20 times the inductance L.

Figure 2:
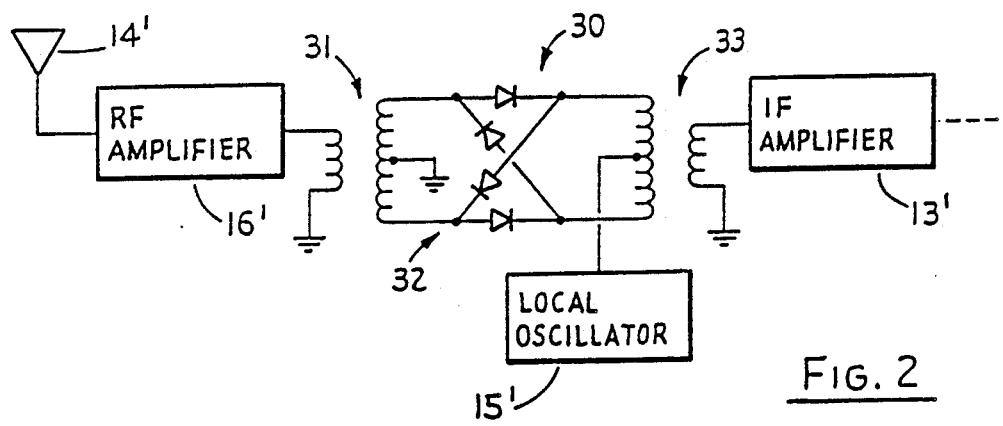
FIG. 2 is a schematic diagram of a doubly-balanced mixer using two transformers in accordance with the present invention.

Turning now to FIG. 2 there is shown a schematic diagram of a conventional doubly-balanced mixer circuit generally designated 30 which includes a balun transformer 31, a directional diode ring 32 including four directional diodes, and a balanced center-tapped transformer 33. As shown, an antenna 14' and a radio frequency amplifier 16' are connected to the primary of the balun transformer 31, a local oscillator 15' connected to the center-tap of the transformer 33, and an intermediate frequency amplifier 13' is connected to an output winding of the center-tapped transformer 33. Since the mixer 30 is doubly balanced, however, the connections and positions of the radio frequency amplifier 16', local oscillator 15' and intermediate frequency amplifier 13' can be interchanged. If the local oscillator frequency is chosen to be higher than the desired radio frequency, for example, it may be desirable to interchange the connections and positions of the antenna 14' and the radio frequency amplifier 16' with the local oscillator 15' in order to reduce the required size of the transformer 31, since the required inductance or size of the transformer 31 is inversely proportional to the frequency of the signal to be coupled from its primary winding to its secondary windings.

Due to the doubly-balanced nature of the mixer 30, the readio frequency amplifier 16' as well as the local oscillator 15' are isolated from the intermediate frequency amplifier 13'. As will become apparent from the discussion below with respect to FIGS. 7–10, however, the isolation of the intermediate frequency amplifier 13' from the local oscillator 15' is limited by capacitive coupling between the windings of the transformer 33 and the relatively high level of the local oscillator signal applied to the center-tap of the transformer 33.

Figure 3:
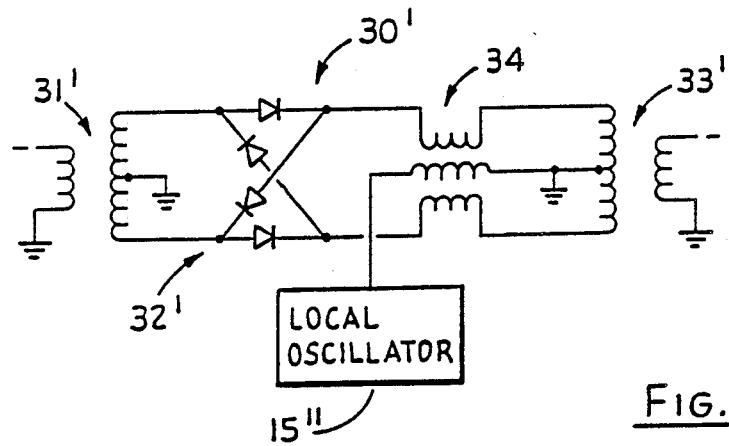
FIG. 3 is a schematic diagram of a doubly-balanced mixer using two balun tranformers in accordance with the present invention.

Turning now to FIG. 3, there is shown an alternative doubly-balanced mixer circuit generally designated 30' the uses a pair of balun transformers 31' and 33' to prevent the problem fo capacitive coupling that could occur for the circuit of FIG. 2. The alternative circuit includes a transformer or strip-line coupler 34 to inject the local oscillator signal across the diode bridge 32'.

Turning now to FIG. 4, there is shown a preferred arrangement for a printed-circuit balun transformer in accordance with the present invention. As shown, the preferred transformer 12 includes printed metal patterns called "traces" on both the top and bottom surfaces of a substrate such as a substrate or circuit board (not shown). The top and bottom traces are distinguished by different cross-hatching, and the bottom trace is shown in dashed outlines. For operation over a local oscillator frequency range of 1.43 to 2.23 GHz, for example, the substrate thickness t is 1.6 mm, the transformer length l is 10 mm, the transformer width w is 5 mm, and the line width of the transformer windings is 0.3 mm. The substrate (not shown), for example, is fire retardant fiberglass circuit board known as "FR4", although multilayer ceramic or other insulating substrates could be used as alternatives.

As is further shown in FIG. 4, the windings of the balun transformer 12 include a pair of first and second co-extensive elongated conductors 41, 42 disposed adjacent one another on opposite sides of the substrate (not shown) to form a strip transmission line being disposed in a loop and having first and second end portions 43, 44. The second conductor 42 has a connection 45 to a ground plane at the first end portion 43 of the strip transmission line, and the first conductor 41 has a connection 46 to the ground plane at the second end portion 44 of the strip transmission line. The first conductor 41 is provided with the terminal 21 at the first end portion of the strip transmission line, and the second conductor 42 is provided with the terminal 22 at the second end portion of the strip transmission line. Due to this construction, a balanced signal is provided from the terminals 21 and 22.

To mount the diode 17, the top printed circuit trace includes pads at the connections 21 and 19. As further described below in connection with FIG. 5, the second diode 18 is preferably included in the same surface mount package as the first diode 17. To provide a connection to the second diode 18, the top trace of the printed circuit also has a mounting pad 47 that is connected to the terminal 22 by a conductive via 48 extending through the substrate (not shown).

For coupling to the local oscillator signal, the balun transformer 12 preferably includes a third elongated conductor 49 disposed on the substrate (not shown) to be co-extensive with the first and second conductors 41, 42. In other words, the third conductor 49 forms a primary winding, while the first and second conductors 41, 42 together form a center-tapped secondary winding of the balun transformer 12.

To equalize the coupling between the primary winding and the first and second conductors 41, 42 of the secondary winding, the primary winding preferably includes a fourth elongated conductor 50 connected in parallel with the third conductor 49 so that the third conductor 49 is adjacent to the first conductor 41 on one side of the substrate, and the fourth conductor 50 is adjacent the second conductor 42 on the other side of the substrate. The third and fourth elongated conductors, for example, have end portions which are connected together by vias 51 and 52. Depending upon the length l and width w of the transformer, it may also be desirable to provide additional vias (not shown) to interconnect the third and fourth conductors at intermediate locations along their lengths. These intermediate vias would ensure that the third and fourth conductors have equal potentials at the intermediate locations.

Turning now to FIGS. 5 and 6, there are shown the top and bottom traces of a printed circuit board 60 of the mixer 11 of FIG. 1 which incorporates the balun transformer of FIG. 4. It should be noted that FIG. 6 is a view of the bottom trace of the circuit board 60 of FIG. 5 as would be seen if one could look through the circuit board 60. The bottom trace is shown in this fashion to facilitate comparison of the adjacent and corresponding areas of the top and bottom traces. The major portion of the bottom trace is devoted to establishing a ground plane 61. The upper trace in FIG. 5 includes strip lines 62, 63 and 64 which are disposed above the ground plane 61 to provide 50 ohm transmission lines for the radio frequency, local oscillator, and intermediate frequency signals. Signal ground is also established on the top of the board by numerous regions of the upper trace which are connected to the ground plane 61 by vias such as the vias 65.

The electrical components in the mixer 10 are shown in dashed representation in FIG. 5 and are mounted on the top of the circuit board 60. The diodes 17 and 18 are included in a surface mount package 66. The package 66, for example, is a Nippon Electric Corporation Part No. ND411G-1, or a Hitachi Part No. HSM88AS, UHF single balanced mixer silicon epitaxial Schottky barrier diode pair.

By using the balance mixer circuit of FIGS. 5 and 6, at a radio frequency of 0.95 to 1.75 GHz, a local oscillator frequency of 1.43 to 2.23 GHz, and an intermediate frequency of 480 MHz, it was possible to obtain a conversion loss of 5.0 to 5.5 dB, a radio frequency input port local oscillator signal rejection of 25 to 30 dB, a compression of about 1 dB at +10 dBm, and a noise figure of 5.0 to 6.0 dB.

Figure 7:
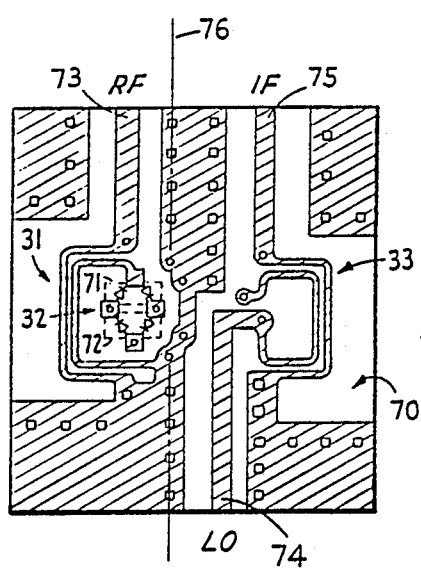
FIG. 7 is a top view of a circuit board including the balanced mixer circuit of FIG. 2.
Figure 8:
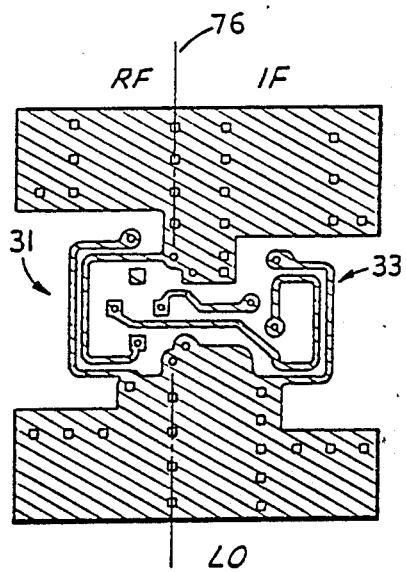
FIG. 8 is a view of the bottom trace of the circuit board of FIG. 7, as would be seen by looking through the circuit board of FIG. 7.

Turning now to FIG. 7, there is shown the top view of a circuit board generally designated 70 including the doubly-balanced mixer generally designated 30 of FIG. 2 which incorporates two printed circuit transformers in accordance with the present invention. The bottom trace of the printed circuit board 70 is shown in FIG. 8, as the bottom trace would appear if one could look through the circuit board. As shown in FIG. 7, the only components mounted to the circuit board 70 are a pair of mixer diode packages 71 and 72, each including two directional diodes in the diode ring 32. The radio frequency (RF), local oscillator (LO), and intermediate frequency (IF) signals are conveyed on strip lines 73, 74 and 75, respectively. As indicated by a section line 76, the radio frequency strip line 73 is fairly well isolated from the local oscillator and intermediate frequency strip lines 74 and 75. This isolation could be enhanced by metal shields disposed along the line 76 and perpendicular to the circuit board 70. Due to the construction of the transformer 33, however, there is some unbalanced capacitive coupling between the local oscillator strip line 74 and the intermediate frequency strip line 75.

Figure 9:
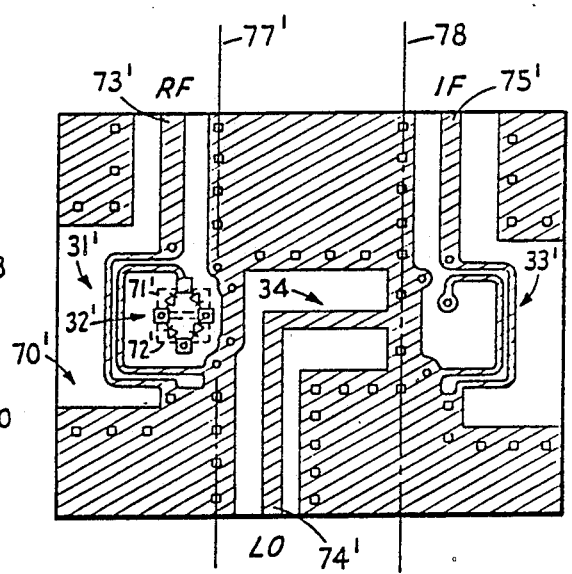
FIG. 9 is a top view of a circuit board including the balanced mixer circuit of FIG. 3.
Figure 10:
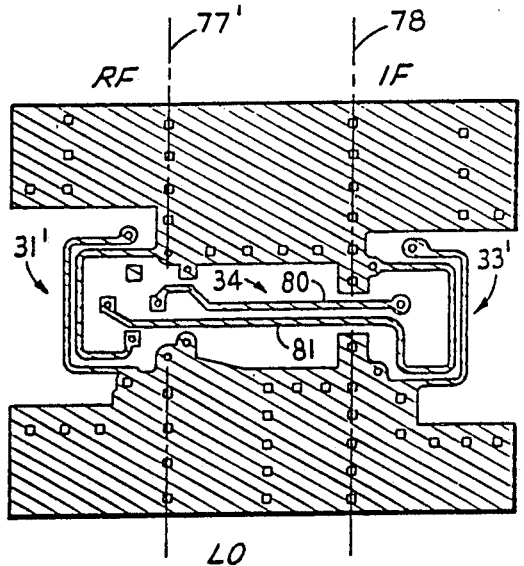
FIG. 10 is a view of the bottom trace of the circuit board of FIG. 9, as would be seen by locking through the circuit board of FIG. 9.

Turning now to FIGS. 9 and 10, there is shown a circuit board 70' and the top and bottom traces for the doubly-balanced mixer circuit of FIG. 3. To reduce unbalanced capacitive coupling between the local oscillator strip line 74' and the intermediate frequency strip line 75', the transformer 33' is a balun transformer, having its center tap connected to the ground plane formed by the top trace in FIG. 9. The local oscillator signal is applied to the diode ring 32' by a strip line coupler 34 which provides inductive and capacitive coupling from the local oscillator strip line 74' to a pair of balanced lines 80, 81 (FIG. 10) formed in the bottom trace. The local oscillator strip line 74' is terminated in a symmetrical fashion at a connection to the ground plane on the top trace. Therefore there is a high degree of isolation between the local oscillator strip line 74' and the intermediate frequency strip line 75' along the plane 78.

In practice a high degree of coupling through the strip line coupler 34 would not be required in a radio receiver, since the strip line 74' could be used as a quarter-wave resonator for the local oscillator (15" in FIG. 3). In this case a rather high signal level would be achieved in the strip line 74'. The quarter-wave resonator could be capacitively loaded at its electrically open end with a varactor diode in the conventional fashion to provide electronic tuning of the resonator and adjustment of the frequency of the local oscillator for selecting a desired radio frequency.

In view of the above, the costs associated with the fabrication and assembly of a balanced transformer onto a circuit board or substrate are eliminated by manufacturing the transformer as part of the printed circuit itself. Balanced mixer circuits have also been disclosed that are especially designed for using such printed circuit transformers. The printed circuit transformers could be used as well in other balanced circuits, such as balanced modulators and baluns for coupling to symmetrical antennas.

For use in the 1 to 2 GHz frequency range, the printed circuit transformers are quite small even though they use "air" cores. To use such miniature transformers at lower frequencies, ferrite cores could be provided by ferrite chips laid over the top and bottom traces of the transformer windings. For even tighter inductive coupling, slots could be provided in a substrate such as a circuit board to permit two pieces of a split ferrite core be joined that would completely encircle the loop of the transformer windings.

Other variations and modifications of the invention can be made by persons of ordinary skill in the art without departing from the spirit and scope of the invention as defined by the appended claims. Although the balanced mixer circuits have been shown to include pairs of two directional diodes or rings of four directional diodes, a series combination of diodes can be substituted for each of the diodes shown in the drawings in order to increase the dynamic range or "compression point" of the mixer. Alternatively, a resistor, having a value of about 6 ohms or more, could be added in series with each of the diodes in the pair or ring, in order to increase the dynamic range or "compression point" of the mixer at the expense of about a 0.5 dB increase in conversion loss.

Although the invention has been described above in terms of conductive elements arranged upon a circuit board or planar substrate consisting of a single planar portion of insulating material, the invention can just as readily be practiced with the conductive elements described above arranged about a planar portion of one or more insulating layers inside a multi-layer substrate. The Du Pont Co., for example, has introduced a ceramic "green tape" material system for fabricating a ceramic substrate having multiple layers formed with printed circuits between the layers. Each layer can be selected with a respective thickness within the range of about 0.025 mm (0.001") to about 0.76 mm (0.030"), and up to 60 or more layers can be defined in a single substrate.

In a multi-layer ceramic substrate, one or more of the layers could include ferrite material to increase the inductive coupling of conductive elements disposed on or between such layers, or to extend the bandwidth of the conductive elements by selection of the ferrite material frequency characteristics. By printing a central conductive ground plane, electromagnetically isolated circuits can be formed between layers on opposite sides of that ground plane. By using some ferrite layers, it should be possible to form a pair of the printed circuit transformers of the present invention disposed adjacent each other on opposite sides of the ground plane with good isolation between the two transformers but with good mutual coupling between the windings of each transformer. In this case the transformer windings would be strip transmission lines with respect to the ground plane, and therefore should have well-behaved electrical properties. Some vias could be formed between the ground plane corresponding to the signal conductors between the plane 76 in FIGS. 7 and 8 or planes 77' and 78 in FIGS. 9 and 10. Other vias could extend to the external surfaces of the multi-layer ceramic substrate for surface mounting of the directional diode packages. In special cases it should be possible to mount the directional diode packages between layers with holes in the outside layers for accessibility. Therefore it should be possible to form the doubly-balanced mixer circuit of FIG. 2 or FIG. 3 above in a package smaller than about 1.5 mm wide, 2.0 mm long, and 5.0 mm thick.

I claim:

1. A printed circuit comprising:
    a substrate including a planar portion of insulating material;
    at least one conductive planar region disposed on said substrate to provide a ground plane; and
    a balun transformer including a pair of first and second coextensive elongated conductors disposed on said planar portion to form a strip transmission line having first and second end portions, said second conductor having a connection to said ground plane at said first end portion of said strip transmission line, and said first conductor having a connection to said ground plane at said second end portion of said strip transmission line, whereby a balanced signal is provided from said first conductor at said first end portion and said second conductor at said second end portion, said transformer including a third elongated conductor disposed on said planar portion and coextensive with said first and second conductors to form a primary winding of said balun transformer, said strip transmission line being disposed in a loop and forming a grounded center-tapped secondary winding of said balun transformer.

2. The printed circuit as claimed in claim 1, wherein said first and second conductors are disposed on respective opposite sides of said planar portion.

3. The printed circuit as claimed claim 1, wherein said first and second conductors are disposed adjacent one another on respective opposite sides of said planar portion, and said printed circuit further includes a fourth elongated conductor disposed on said planar portion and coextensive with said first and second conductors, said third and fourth conductors being disposed adjacent one another on respective opposite sides of said planar portion.

4. The printed circuit as claimed in claim 3, further including via connections through said planar portion interconnecting respective end portions of said third and fourth conductors.

5. The printed circuit as claimed in claim 1, further including first and second directional diodes each having respective first and second terminals, the first terminal of said first diode being connected to said first conductor at said first end portion, the second terminal of said first diode being connected to the first terminal of said second diode, and the second terminal of said second diode being connected to said second conductor at said second end portion.

6. The printed circuit as claimed in claim 5, further comprising frequency selective circuit means for connecting said second terminal of said first diode and the first terminal of said second diode to a radio frequency amplifier and an intermediate frequency amplifier while isolating said intermediate frequency amplifier from said radio frequency amplifier.

7. The printed circuit as claimed in claim 5, further comprising third and fourth directional diodes connected to each other at a common connection point and connected to said first and second directional diodes to form a diode ring, and a second transformer having a first winding interconnecting the respective common connection points of said first and second diodes and said third and fourth diodes, and a second winding.

8. The printed circuit as claimed in claim 7, wherein said second transformer is a balun transformer.

9. A printed circuit comprising:
a substrate including a planar portion of insulating material; and
a transformer including a pair of first and second coextensive elongated conductors disposed on respective opposite sides of said planar portion to form a strip transmission line having first and second end portions, said second conductor having a connection to a center tap at said first end portion of said strip transmission line, and said first conductor having a connection to said center tap at said second end portion of said strip transmission line, and a third elongated conductor disposed on said portion and coextensive with said first and second conductors to form a primary winding of said transformer, said strip transmission line being disposed in a loop and forming a center-tapped secondary winding of said transformer.

10. The printed circuit as claimed in claim 9, further including a fourth elongated conductor disposed on said planar portion and coextensive with said first and second conductors, said third and fourth conductors being disposed adjacent one another on respective opposite sides of said planar portion.

11. The printed circuit as claimed in claim 10, further including via connections through said planar portion interconnecting respective end portions of said third and fourth conductors.

12. The printed circuit as claimed in claim 9, further including first and second directional diodes each having respective first and second terminals, the first terminal of said first diode being conected to said first conductor at said first end portion, the second terminal of said first diode being connected to the first terminal of said second diode, and the second terminal of said second diode being connected to said second conductor at said second end portion.

13. The printed circuit as claimed in claim 12, further comprising third and fourth directional diodes connected to each other at a common connection point and connected to said first and second directional diodes to form a diode ring, and a second transformer having a first winding interconnecting the respective common connection points of said first and second diodes and said third and fourth diodes, and a second winding.

14. The printed circuit as claimed in claim 13, wherein said second transformer is a balun transformer.

15. A printed circuit comprising:
a substrate including a planar portion of insulating material; and
a transformer including a pair of first and second coextensive elongated conductors disposed on said planar portion to form a strip transmission line having first and second end portions, said strip transmission line being disposed in a loop, said second conductor having a connection to a center tap at said first end portion of said strip transmission line, and said first conductor having a connection to said center tap at said second end portion of said strip transmission line, wherein said first and second conductors are disposed on respective opposite sides of said planar portion.

said transformer including third and fourth elongated conductors coextensive with said first and second conductors and disposed adjacent one another on respective opposite sides of said planar portion.

16. The printed circuit as claimed in claim 15, further including via connections through said planar portion interconnecting respective end portions of said third and fourth conductors.

17. The printed circuit as claimed in claim 15, further including at least one conductive region disposed on said substrate to provide a ground plane, and wherein said center tap is a portion of said ground plane.

18. A printed circuit comprising:
a substrate including a planar portion of insulating material;
at least one conductive planar region disposed on said substrate to provide a ground plane; and
a balun tramsformer including
a pair of first and second coextensive elongated conductors disposed on respective opposite sides of said planar portion to form a strip transmission line having first and second end portions, said strip transmission line being disposed in a loop, said second conductor having a connection to said ground plane at said first end portion of said strip transmission line, and said first conductor having a connection to said ground plane at said second end portion of said strip transmission line, and a pair of third and fourth elongated conductors disposed adjacent one another on respective opposite sides of said planar portion and coextensive with said first and second conductors said third conductor forming a primary winding of said balun transformer and said strip transmission line forming a grounded center-tapped secondary winding of said balun transformer.

19. The printed circuit as claimed in claim 18, further including via connections through said planar portion interconnecting respective end portions of said third and fourth conductors.

* * * * *